United States Patent
Gheewala

[11] Patent Number: 6,091,090
[45] Date of Patent: *Jul. 18, 2000

[54] POWER AND SIGNAL ROUTING TECHNIQUE FOR GATE ARRAY DESIGN

[75] Inventor: Tushar R. Gheewala, Los Altos, Calif.

[73] Assignee: In-Chip Systems, Inc., Sunnyvale, Calif.

[ * ] Notice: This patent is subject to a terminal disclaimer.

[21] Appl. No.: 08/933,552

[22] Filed: Sep. 19, 1997

Related U.S. Application Data

[60] Provisional application No. 60/027,448, Sep. 27, 1996.

[51] Int. Cl.$^7$ .................................................. H01L 27/10
[52] U.S. Cl. ........................... 257/211; 257/207; 257/208
[58] Field of Search ................................. 257/207, 208, 257/758, 211, 202

[56] References Cited

U.S. PATENT DOCUMENTS

| | | | |
|---|---|---|---|
| 5,132,571 | 7/1992 | McCollum et al. | 307/465.1 |
| 5,191,241 | 3/1993 | McCollum et al. | 307/465 |
| 5,309,015 | 5/1994 | Kuwata et al. | 257/659 |
| 5,471,093 | 11/1995 | Cheung | 257/758 |
| 5,576,554 | 11/1996 | Hsu | 257/48 |
| 5,631,478 | 5/1997 | Okumura | 257/211 |
| 5,691,574 | 11/1997 | Suzuki | 257/758 |
| 5,723,883 | 3/1998 | Gheewala | 257/204 |
| 5,727,180 | 3/1998 | Davis et al. | 395/427 |
| 5,742,099 | 4/1998 | Debnath et al. | 257/758 |
| 5,777,360 | 7/1998 | Rostoker et al. | 257/315 |
| 5,923,059 | 7/1999 | Gheewala | 257/204 |

Primary Examiner—Jerome Jackson, Jr.
Assistant Examiner—B William Baumeister
Attorney, Agent, or Firm—Townsend and Townsend and Crew LLP

[57] ABSTRACT

A layout architecture for routing local and global interconnections for a gate array integrated circuit wherein basic cells are arranged as an array with columns and rows. Local interconnection and global interconnections are routed on the first metal layer in a direction parallel to the rows (horizontal). Power supply signals and global interconnection are routed in the second metal layer in a direction parallel to the rows (horizontal). Global interconnections are routed on the third metal layer in a direction parallel to the columns (vertical).

20 Claims, 2 Drawing Sheets

POWER AND SIGNAL ROUTING TECHNIQUE FOR GATE ARRAY DESIGN

This application claims the benefit of Provisional Application Ser. No. 60/027,448, filed Sep. 27, 1996, incorporated herein by reference.

BACKGROUND OF THE INVENTION

The present invention relates, in general, to cell-based integrated circuits such as gate arrays, and in particular, to an improved power and signal routing architecture and technique to achieve high density cell design for gate arrays.

Gate array technology, also known as standard cell design, has been developed as a method of quickly designing integrated circuits. Gate array technology is characterized by patterns of regularly placed transistors. The transistors are arranged in patterns known as basic cells. Basic cells are the smallest building block of the technology and are configured for dense placement and efficient signal routing. Typically, the basic cells are placed on the integrated circuit in an array pattern with rows and columns.

Basic cells are combined into predesigned circuit units known as "macro cells." Macro cells are commonly used elements such as NAND gates, NOR gates, and flip-flops. A designer selects desired elements from a library of macro cells and places them in a design. The macro cells may be interconnected in a variety of ways to perform desired functions. By being able to select macro cells from a library and place them into a design, a designer can quickly design complex functions without having to worry about the details of each individual transistor. Typically, a library of macro cells are designed from basic cells for a certain technology, and their design characteristics do not change from one design to the next.

Because a designer will use many macro cells in a particular design, it is important that the macro cells be designed as efficiently as possible. Otherwise, the inefficiencies will be multiplied, since they are replicated with every instance of the macro cell in the design.

As described above, the macro cells are made up of interconnected basic cells. Local interconnections are used to interconnect the basic cells to form macro cells. Global interconnections are used to route signal from macro cells to other macro cells, input/output terminals, and power supply sources. Clock signals, reset signals, power signals, and test signals are examples of signals that may be routed by global interconnections. It is important that the basic cells be designed such that local and global interconnections can be made efficiently.

One concern of a gate array designer is routing VDD and GROUND power supply traces to the transistors of the basic cells efficiently. FIG. 1 shows a prior art design taught, for example, in U.S. Pat. Nos. 5,072,285, 4,682,201, 4,884,118, 4,783,692, and others, to route power supply traces to basic cells.

FIG. 1 shows a portion of one row of a gate array design with two basic cells 101. Each basic cell 101 comprises a p-type diffusion region 105 and an n-type diffusion region 107. Two gate regions 113 extend across p-type diffusion region 105 forming a pair of PMOS transistors and two gate regions 115 extend across n-type diffusion region 107, forming a pair of NMOS transistors.

Several basic cells 101 are arranged in rows and columns on a substrate forming an array of basic cells 101. Power supply trace 130 extends across rows of basic cells 101 in the metal one (M1) layer above p-type diffusion region 105. Typically, power supply trace 130 is coupled to a VDD power supply source (not shown). Similarly, power supply trace 132 is formed on the M1 layer above n-type diffusion region 107, and is typically coupled to a GROUND (VSS) power supply source (not shown). Power supply traces 130 and 132 extend across rows of the array.

Most commonly, power supply traces 130 and 132 are connected to diffusion region 105 and 107 at a common node between the two transistors by contacts 140 and 142. An advantage of this layout is that a direct connection can be made between power supply traces 130 and 132 and diffusion regions 105 and 107, without additional metal routing.

Traditionally, as shown in the basic cell of FIG. 1, the M1 layer has been used to route power supply traces and other global interconnections in the direction parallel the rows (horizontal). Second layer metal (M2) has been used for global interconnections in the direction parallel the columns (vertical), and third layer metal (M3) for routing global interconnections in the direction parallel the rows (horizontal).

A disadvantage of this architectural layout is that power supply traces 130 and 132 block vertical traces on the M1 layer. This restricts the number of local interconnections that can be made on the M1 layer, thus requiring an increased use of the M2 layer to cross over power supply traces 130 and 132. For example, in FIG. 1, local interconnection 140 is located on the M2 layer in order to cross over power supply traces 130 and 132. Having local interconnections on the M2 layer causes significant blockage for M2 layer global routing, and hence lower gate density.

It is desirable to provide a more efficient routing scheme that reduces the blockage of global signal routing.

SUMMARY OF THE INVENTION

The present invention discloses a layout architecture for a gate array integrated circuit wherein basic cells are arranged in rows and columns with first, second, and third metal layers residing above the basic cells. The second metal layer is above the first metal layer and has a plurality of conductive traces carrying power across the rows and global interconnection signals parallel to the rows between power busses at lateral edges in the outside columns. The first metal layer has a plurality of conductive traces carrying local interconnection signals, and carrying global interconnection signals parallel to the rows. The third metal layer is above the second metal layer and has a plurality of conductive traces carrying global interconnection signals parallel to the columns.

This layout architecture provides superior routability for power and routing signals in an integrated circuit, and particularly for gate array designs. Among its many advantages, local interconnections on the first metal layer are not blocked by power supply traces in this layout architecture.

Further features of the invention, its nature and various advantages will be more apparent from the accompanying drawings and the following detailed description of the specific embodiments.

DESCRIPTION OF THE SPECIFIC EMBODIMENT

Figure 2:
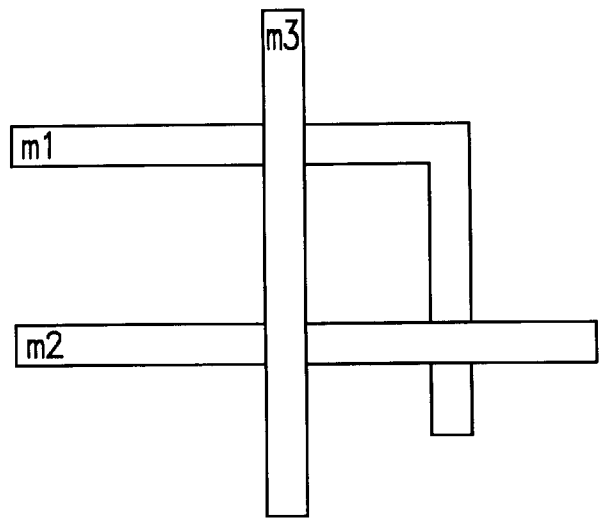
FIG. 2 is an abstract diagram showing the relationship between conductive traces on the first, second, and third metal layers according to the present invention.

FIG. 2 is an abstract diagram showing the relationship between conductive traces on a first metal layer M1, a second metal layer M2, and third metal layer M3 according to the present invention. The horizontal direction in FIG. 2 corresponds to the direction of a gate array integrated circuit parallel to rows of basic cells, while the vertical direction correspond to the direction of a gate array parallel to the columns.

The first metal layer M1 is used for local interconnections and for global interconnections extending across the substrate in a direction parallel to rows of the gate array. Although some power may be carried on these M1 layer global interconnections, they are not used as the main power supply grid for the integrated circuit. FIG. 2 shows a local interconnection trace on the M1 layer extending in directions parallel to both the rows and the columns. This is allowed by the architecture since local interconnections will not block global routing except in that local area. Global interconnections on the first metal layer are limited to the direction predominantly parallel to the rows, except for minor departures therefrom as needed.

A second metal layer, M2 is used for power supply traces and other global interconnections extending across the substrate predominantly parallel to the rows. A third metal layer, M3 is used for global interconnections predominantly extending across the substrate in a direction parallel to the columns.

Although there may be some short departures from the direction of traces on each of these layers, the general trend is in the directions described. Departures from the general layout scheme as described may be made for solving routing problems. For example, local interconnection traces may be placed on any of the three metal layers when it is desirable to do so to make a connection.

Figure 1:
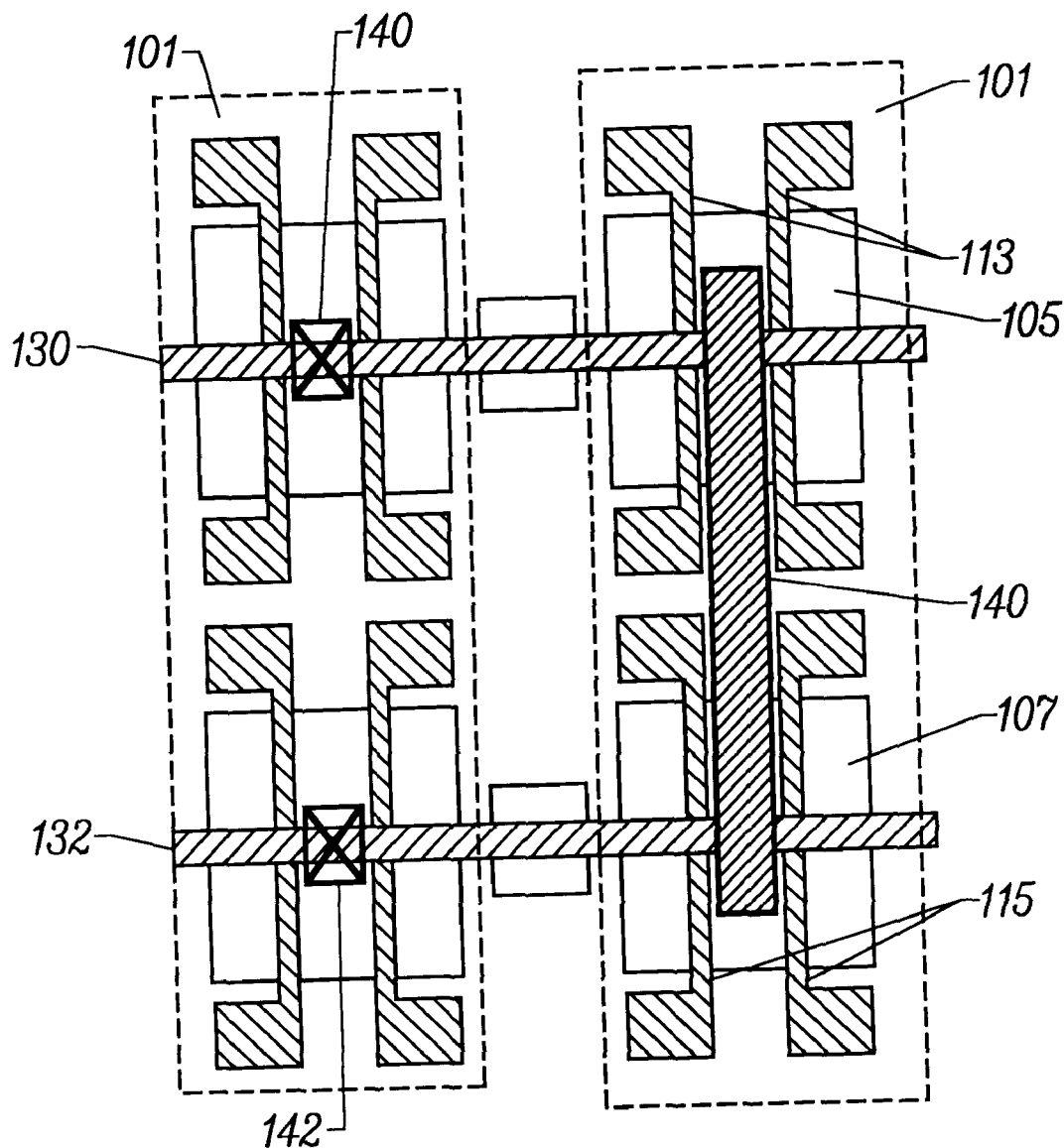
FIG. 1 is a planer representation of a prior art layout architecture.
Figure 3:
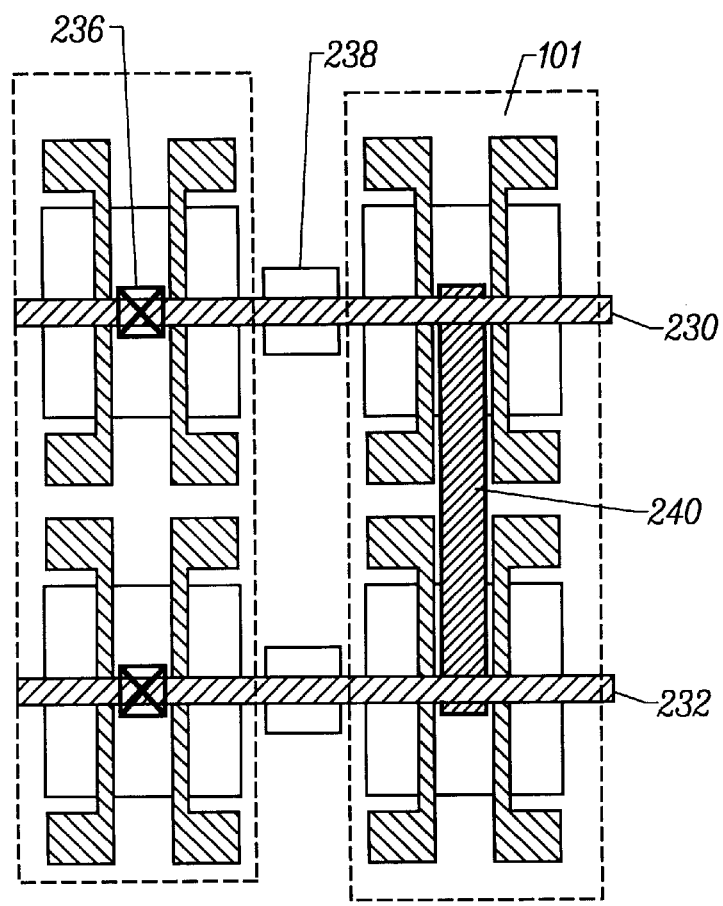
FIG. 3 is a planer diagram of a pair of basic cells 101 with local interconnections on the first metal layer and power supply signals on the second metal layer.

FIG. 3 is a planer diagram of a portion of a row of the gate array with two basic cells 101 and routing signals 230, 232, and 240 according to the architecture of the present invention. Basic cells 101 are described above with respect to FIG. 1. However, basic cell 101 is shown only by way of example. Basic cell 101 may be advantageously replaced with one or more different basic cells now known, or later developed. For example, a preferable basic cell is described in commonly assigned U.S. Pat. Appl. Ser. No. 08/557,474, now U.S. Pat. No. 5,723,883 by the present inventor, which is incorporated herein by reference for all purposes.

In FIG. 3, a plurality of basic cells 101 are provided in rows in an integrated circuit forming an array of basic cells 101. The basic cells may be aligned vertically from row to row, or the rows may be shifted with respect to each other. Commonly assigned, copending U.S. Appl. Ser. No. 08/917,006 by the present inventor, which is incorporated herein by reference for all purposes, describes other preferable basic cell designs. In particular, it describes an architectural layout with adjacent rows of basic cells shifted laterally with respect to each other to allow sharing of power supply traces. It will be recognized by one of skill in the art that traditional basic cell layout architectures or other known or yet to be developed architectures may be used advantageously according to the principles of the present invention.

In the specific embodiment, an integrated circuit has rows of basic cells 101 covered by three layers of metal. Each layer of metal is separated from the other by an insulating layer. The first layer of metal is nearest the substrate, the second layer of metal is above the first layer, and the third layer is above the second layer of metal and is the farthest layer from the substrate. If desired, additional metal layers may also be used in conjunction with the principles of the present invention.

A power supply trace 230 in the second layer of metal extends across each of the rows of basic cells 101 parallel to the rows. It preferably extends over the p-type diffusion region of basic cell 101 and is coupled with a VDD power supply source (not shown). Power supply trace 230 may be, for example, coupled to a power bus located at a lateral edge of the array in a column outside basic cells 101, which is connected to the VDD power supply source. A second power supply trace 232 in the second layer of metal extends across the n-type diffusion region of each of the rows of basic cells 101 and is coupled with a GROUND power supply source (not shown). Power supply trace 232 may be, for example, coupled to a power bus located at a lateral edge of the array in an column outside basic cells 101, which is coupled to the GROUND power supply source. Alternatively, the VDD and GROUND power supplies may be coupled to power supply traces 230 and 232 respectively through power bus traces running parallel to columns of the array on the third metal layer.

Stacked via contacts 236 couple power supply traces 230 and 232 with individual basic cells 101. Other stacked via contacts 238 may couple power supply traces 230 and 232 with the substrate for biasing the substrate. Of course, other methods besides stacked via contacts may be used to make the connections.

An advantage of forming power supply traces 230 and 232 on the second layer of metal is that it frees up the first level of metal for routing of local interconnections. In FIG. 3, a local interconnection 240 couples p-type diffusion region 105 with n-type diffusion region 107 of basic cell 101. This is a commonly used configuration in CMOS design. Because power supply traces 230 and 232 are in the second layer of metal, local interconnection 240 is not blocked as it was in the prior art.

In addition to routing power to basic cells 101, other global interconnection signals such as clocks, input/output signals, reset signals, routing signals, test signals, and the like are generally needed for a gate array device. These signals are routed on global interconnect traces on the three metal layers. For traces predominantly extending in the direction parallel to the rows, the traces are formed on the first and second layers of metal. For traces predominantly extending in a direction parallel to the columns, the traces are formed on the third metal layer. Metal vias are used to connect conductive traces on different levels together.

The layout architecture described above has significant advantages over the prior art. Among the advantages is that it frees up the conductive metal traces on the first metal layer beneath power supply traces 230 and 230 to interconnect the transistors of basic cell 101 to make desired logic functions. In the specific embodiment, this reduces the cell height to ten tracks rather than the twelve tracks that were generally required using prior art designs such as that shown in FIG. 1. This is a 20% increase in the density of the gate array. Furthermore, the lower cell height of the basic cells results in smaller PMOS and NMOS transistors, thus reducing the capacitance and power dissipation of the integrated circuit.

While a specific embodiment of the invention is described herein, it will be recognized that changes may be made without departing from the spirit and scope of the present invention. For example, to solve some routing problems, it may be desirable to depart from the described layout architecture. For example, long signals may make short jogs in other directions to solve a localized routing problem. Also, local interconnections may be made on any of the layers as needed to find a path. The specific embodiment above is intended by way of description for the understanding of the invention and no limitation is intended or implied. The invention is intended to be limited only by the attached claims.

What is claimed is:

1. In an integrated circuit implementing a standard cell architecture organized in rows and columns of basic cells, a layout architecture, comprising:

first, second, and third adjacent metal layers, wherein the first metal layer is disposed between the second metal layer and the basic cells, and the second metal layer is disposed between the third metal layer and the first metal layer;

a plurality of first traces on the first metal layer extending across the integrated circuit predominantly in a direction parallel to the rows, wherein the first traces include global interconnection signal carrying traces;

a plurality of second traces on the second metal layer extending across the integrated circuit predominantly in the direction parallel to the rows, wherein the second traces include global interconnection signal carrying traces;

a plurality of third traces on the third metal layer extending across the integrated circuit predominantly in a direction parallel to the columns; and a plurality of fourth traces on the first metal layer providing local interconnections for the basic cells.

2. The layout architecture of claim 1, wherein the plurality of second traces include power carrying traces.

3. The layout architecture of claim 1, wherein the first traces are not used for global power distribution.

4. The integrated circuit of claim 1 wherein no metal layer is disposed between the first metal layer and the basic cells.

5. In an integrated circuit implementing a standard cell architecture organized in rows and columns of basic cells, a layout architecture, comprising:

first, second, and third adjacent metal layers, wherein the first metal layer is disposed between the second metal layer and the basic cells, and the second metal layer is disposed between the third metal layer and the first metal layer;

a plurality of first traces on the first metal layer extending across the integrated circuit predominantly in a direction parallel to the rows, wherein the first traces include global interconnection signal carrying traces;

a plurality of second traces on the second metal layer extending across the integrated circuit predominantly in the direction parallel to the rows, wherein the second traces include global interconnection signal carrying traces and power carrying traces, wherein the power carrying traces are directly above diffusion regions of the basic cells;

a plurality of third traces on the third metal layer extending across the integrated circuit predominantly in a direction parallel to the columns; and a plurality of fourth traces on the first metal layer providing local interconnections for the basic cells.

6. In an integrated circuit implementing a standard cell architecture organized in rows and columns of basic cells, a layout architecture, comprising:

first, second, and third adjacent metal layers, wherein the first metal layer is disposed between the second metal layer and the basic cells, and the second metal layer is disposed between the third metal layer and the first metal layer;

a plurality of first traces on the first metal layer extending across the integrated circuit predominantly in a direction parallel to the rows, wherein the first traces include global interconnection signal carrying traces;

a plurality of second traces on the second metal layer extending across the integrated circuit predominantly in the direction parallel to the rows, wherein the second traces include global interconnection signal carrying traces and power carrying traces, wherein the power carrying traces are directly above substrate contacts;

a plurality of third traces on the third metal layer extending across the integrated circuit predominantly in a direction parallel to the columns; and a plurality of fourth traces on the first metal layer providing local interconnections for the basic cells.

7. An integrated circuit architecture for a gate array, comprising:

first, second, and third adjacent metal layers, wherein the first metal layer is disposed between the second metal layer and the basic cells, and the second metal layer is disposed between the third metal layer and the first metal layer;

a plurality of basic cells arranged as an array in rows and columns, each basic cell comprising:

a diffusion region; and a gate region extending across the diffusion region in a vertical direction;

a plurality of first conductive traces on a first metal layer extending across the integrated circuit predominantly in a direction parallel to the rows, the first conductive traces including global interconnection signal carrying traces;

a plurality of second conductive traces on the second metal layer, the second conductive traces extending across the integrated circuit predominantly in a directions parallel to the rows; and a plurality of third conductive traces on the third metal layer, the third conductive traces extending across the integrated circuit predominantly in a direction parallel to the columns.

8. The integrated circuit architecture of claim 7, wherein the first conductive traces include local interconnections for the basic cells.

9. The integrated circuit architecture of claim 7, wherein the second conductive traces include power carrying traces that are coupled to a power supply source.

10. The integrated circuit architecture of claim 6 wherein the second conductive traces include global interconnect traces extending across the integrated circuit predominantly in the direction parallel to the rows.

11. An integrated circuit architecture for a gate array, comprising:

first, second, and third adjacent metal layers, wherein the first metal layer is disposed between the second metal layer and the basic cells, and the second metal layer is disposed between the third metal layer and the first metal layer;

a plurality of basic cells arranged as an array in rows and columns, each basic cell comprising:

a diffusion region; and a gate region extending across the diffusion region in a vertical direction;

a plurality of first conductive traces on a first metal layer extending across the integrated circuit predominantly in a direction parallel to the rows, the first conductive traces including global interconnection signal carrying traces;

a plurality of second conductive traces on the second metal layer, the second conductive traces being directly above the diffusion region and coupled to a power supply source and extending across the integrated circuit predominantly in a directions parallel to the rows; and a plurality of third conductive traces on the third metal layer, the third conductive traces extending across the integrated circuit predominantly in a direction parallel to the columns.

12. An integrated circuit architecture for a gate array, comprising:

first, second, and third adjacent metal layers, wherein the first metal layer is disposed between the second metal layer and the basic cells, and the second metal layer is disposed between the third metal layer and the first metal layer;

a plurality of basic cells arranged as an array in rows and columns, each basic cell comprising:
a diffusion region; and
a gate region extending across the diffusion region in a vertical direction;

a plurality of first conductive traces on a first metal layer extending across the integrated circuit predominantly in a direction parallel to the rows, the first conductive traces including global interconnection signal carrying traces;

a plurality of second conductive traces on the second metal layer, the second conductive traces extending across the integrated circuit predominantly in a directions parallel to the rows;

a plurality of third conductive traces on the third metal layer, the third conductive traces extending across the integrated circuit predominantly in a direction parallel to the columns; and substrate contacts interspersed throughout the gate array, wherein the second conductive traces are directly above the substrate contacts.

13. A standard cell architecture comprising:

a plurality of basic cells arranged in an array;

first, second, and third adjacent metal layers, the second metal layer being above the first metal layer, and the third metal layer being above the second metal layer;

a plurality of first conductive traces on the first metal layer for carrying local interconnection signals between basic cells to form macro cells;

a plurality of second conductive traces on the first metal layer for carrying global interconnection signals to the basic cells, the second conductive traces predominantly extending across the basic cells in the direction parallel to the rows;

a plurality of third conductive traces on the second metal layer for carrying global interconnection signals to the basic cells, the third conductive traces predominantly extending across the basic cells in a direction parallel to the rows;

a plurality of fourth conductive traces on the second metal layer for carrying power to the basic cells, the fourth conductive traces predominantly extending across the basic cells in the direction parallel to the rows; and a plurality of fifth conductive traces on the third metal layer for carrying global interconnection signals to the basic cell, the fifth conductive traces predominantly extending across the basic cells in a direction parallel to the columns.

14. The standard cell architecture of claim 13, further comprising a plurality of sixth conductive traces on the third metal layer for carrying power to the basic cells, the sixth conductive traces predominantly extending across the basic cells in the direction parallel to the columns.

15. In an integrated circuit implementing a standard cell architecture organized in perpendicular rows and columns of basic cells, a layout architecture, comprising:

first, second, and third metal layers, the first metal layer being beneath the second metal layer, and the second metal layer being beneath the third metal layer, wherein no metal layer is disposed between the first and second metal layers, and no metal layer is disposed between the second and third metal layers;

a plurality of first traces on the first metal layer extending across the integrated circuit in a direction parallel to the rows, wherein the first traces include global interconnection signal carrying traces;

a plurality of second traces on the second metal layer extending across the integrated circuit in the direction parallel to the rows, wherein the second traces include global interconnection signal carrying traces; and a plurality of third traces on the third metal layer extending across the gate array in a direction parallel to the columns.

16. The integrated circuit of claim 15 further comprising a plurality of fourth traces on the first metal layer providing local interconnections for the basic cells.

17. The integrated circuit of claim 15 wherein the plurality of traces on the metal layer adjacent the metal layer closest to the basic cells comprises global interconnection signal carrying traces.

18. The integrated circuit of claim 17 wherein the global interconnection signal carrying traces are coupled to a power supply.

19. In an integrated circuit implementing a standard cell architecture organized in perpendicular rows and columns of basic cells, a layout architecture, comprising:

a plurality of adjacent metal layers, each of said adjacent metal layers having a plurality of traces extending across the integrated circuit in a direction parallel to the rows; and a first metal layer adjacent to and above the first plurality of adjacent metal layer, the first metal layer having a plurality of traces extending across the gate array in a direction parallel to the columns.

20. The layout architecture of claim 19 further comprising a first and second metal layer in the plurality of adjacent metal layers, the first metal layer being closest to the basic cells and the second metal layer being adjacent the first metal layer, wherein the plurality of traces in the second metal layer are coupled to a power supply for distributing power to the basic cells.

* * * * *